(12) United States Patent  (10) Patent No.: US 10,879,060 B2
Yamaguchi  (45) Date of Patent: Dec. 29, 2020

(54) SUBSTRATE PROCESSING APPARATUS, METHOD OF MANUFACTURING SEMICONDUCTOR DEVICE, AND STORAGE MEDIUM

(71) Applicant: TOKYO ELECTRON LIMITED, Tokyo (JP)

(72) Inventor: Tatsuya Yamaguchi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 8 days.

(21) Appl. No.: 16/181,819

(22) Filed: Nov. 6, 2018

(65) Prior Publication Data

US 2019/0139756 A1  May 9, 2019

(30) Foreign Application Priority Data

Nov. 7, 2017  (JP) .................. 2017-214863

(51) Int. Cl.
*H01L 21/31* (2006.01)
*H01L 21/02* (2006.01)
(Continued)

(52) U.S. Cl.
CPC .......... *H01L 21/02118* (2013.01); *B05B 1/24* (2013.01); *B05B 1/30* (2013.01);
(Continued)

(58) Field of Classification Search
CPC ......... H01L 21/02118; H01L 21/31144; H01L 21/02271; H01L 21/31116; H01L 21/02282; H01L 21/6715; H01L 21/76811; H01L 21/31138; H01L 21/76826; H01L 21/3105; H01L 21/32139; H01L 21/0271; H01L 21/266; H01L 21/31058; H01L 21/67017; H01L 21/76828; H01L 21/0228; H01L 21/67063; H01L 21/67103;
(Continued)

(56) References Cited

U.S. PATENT DOCUMENTS 9,414,445 B2   8/2016  Ahmad et al.
2014/0322921 A1* 10/2014  Ahmad ............... H05B 6/80
                                                    438/780

FOREIGN PATENT DOCUMENTS

JP   2016163860 A   9/2016
TW     201623669 A   7/2016

* cited by examiner

*Primary Examiner* — Robert G Bachner
(74) *Attorney, Agent, or Firm* — Nath, Goldberg & Meyer; Jerald L. Meyer

(57) ABSTRACT

A substrate processing apparatus for processing a substrate to manufacture a semiconductor device, includes: a mounting table on which a substrate is mounted; a first liquid supply part that supplies a first liquid to form a polymer film having a urea bond on the substrate mounted on the mounting table; a second liquid supply part that supplies a second liquid reacting with the first liquid; and a nozzle part provided at an end portion of a liquid flow path where the first liquid supplied from the first liquid supply part and the second liquid supplied from the second liquid supply part are joined with each other to obtain a mixed solution, and configured to supply the mixed solution to the substrate to form the polymer film on a surface of the substrate, wherein the polymer film is temporarily used for manufacturing the semiconductor device and is subsequently removed by depolymerization.

12 Claims, 15 Drawing Sheets

(51) Int. Cl.
*H01L 21/67* (2006.01)
*H01L 21/687* (2006.01)
*B08B 7/00* (2006.01)
*B05B 1/24* (2006.01)
*B05B 1/30* (2006.01)
*H01L 21/311* (2006.01)
*H01L 21/768* (2006.01)

(52) U.S. Cl.
CPC ........ *B08B 7/0014* (2013.01); *H01L 21/0206* (2013.01); *H01L 21/02282* (2013.01); *H01L 21/31116* (2013.01); *H01L 21/31144* (2013.01); *H01L 21/6715* (2013.01); *H01L 21/67051* (2013.01); *H01L 21/68764* (2013.01); *H01L 21/768* (2013.01)

(58) Field of Classification Search
CPC ............... H01L 21/6719; H01L 21/768; H01L 21/76834; H01L 21/67051; C23C 16/4584; C23C 16/0245; C23C 16/481; C23C 16/30; C23C 16/44; C23C 16/4405; C23C 16/45563; C23C 16/45578; C23C 16/46; C23C 16/52; B05B 1/24; B05B 1/30
See application file for complete search history.

(R" = R or R')

Reference Example 1-1

Liquid state maintained

Reference Example 1-2

Solidified

FIG. 16A  Reference Example 2-1 (10 minutes after mixing)
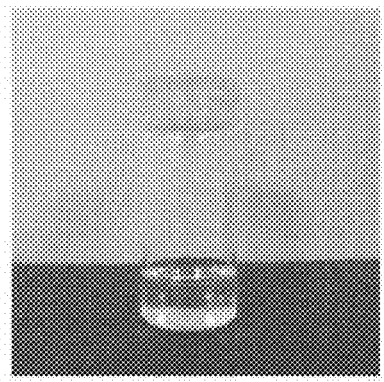
FIG. 16B  Reference Example 2-2 (20 minutes after mixing)
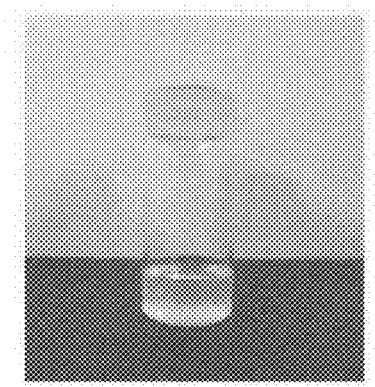
FIG. 16C  Reference Example 2-3 (30 minutes after mixing)
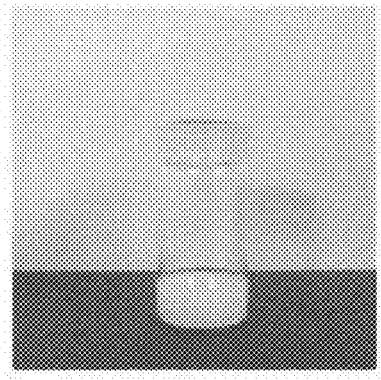

Example 3-4

Comparative Example 3-4

SUBSTRATE PROCESSING APPARATUS, METHOD OF MANUFACTURING SEMICONDUCTOR DEVICE, AND STORAGE MEDIUM

CROSS-REFERENCE TO RELATED APPLICATION

This application is based upon and claims the benefit of priority from Japanese Patent Application No. 2017-214863, filed on Nov. 7, 2017, the entire contents of which are incorporated herein by reference.

TECHNICAL FIELD

The present disclosure relates to a technique for forming a film temporarily used in a manufacturing process of a semiconductor device.

BACKGROUND

In a manufacturing process of a semiconductor device, a film called a sacrificial film may be used in some cases. The sacrificial film is a film temporarily used in the manufacturing process and removed in the middle of the manufacturing process so that the film is not included in a semiconductor device which is a product. Examples of the sacrificial film include films used for a variety of purposes, such as an intermediate mask formed below a resist mask in a corresponding relationship with the resist mask, a pattern mask (below-described hard mask) used for separating a trench and a via hole in a dual damascene, and the like.

There has been proposed a technique in which when a process using plasma etching or the like is performed with respect to a porous low dielectric constant film as an example of a member temporarily used in a manufacturing process of a semiconductor device, damage causing an increase in dielectric constant is suppressed by embedding a resin into pores of the low dielectric constant film.

Meanwhile, it is necessary to remove the resin embedded in the pores of the used sacrificial film or the used low dielectric constant film from the semiconductor device under manufacture. At this time, it is preferable to select a sacrificial film or a material embedded in pores, which can be removed without using any method that may cause damage to materials constituting the semiconductor device, such as plasmas or the like.

To address the above, the present inventors have been developing a technique of selecting a sacrificial film or a material embedded in the pores of a low dielectric constant film, which can be relatively easily removed, and forming a film on the surface of a semiconductor device under manufacture using the material.

Furthermore, there is known a technique of coating a polyurea resin by blending an isocyanate and an amine compound each having a curing retardant and then spraying the mixture onto a ceiling or a wall to be treated. However, this technique greatly differs in technical field from the manufacture of a semiconductor device. There is no description or suggestion on a technique which makes use of a polyurea resin in a manufacturing process of a semiconductor device.

SUMMARY

Some embodiments of the present disclosure provide a substrate processing apparatus capable of forming a relatively easily removable polymer film having a urea bond on a substrate used for manufacturing a semiconductor device, a method of manufacturing the semiconductor device, and a non-transitory computer-readable storage medium storing the method.

According to one embodiment of the present disclosure, there is provided a substrate processing apparatus for processing a substrate to manufacture a semiconductor device, including: a mounting table on which a substrate is mounted; a first liquid supply part configured to supply a first liquid to form a polymer film having a urea bond on the substrate mounted on the mounting table; a second liquid supply part configured to supply a second liquid that reacts with the first liquid; and a nozzle part provided at an end portion of a liquid flow path where the first liquid supplied from the first liquid supply part and the second liquid supplied from the second liquid supply part are joined with each other to obtain a mixed solution, and configured to supply the mixed solution to the substrate to form the polymer film on a surface of the substrate mounted on the mounting table, wherein the polymer film is temporarily used for manufacturing the semiconductor device and is subsequently removed by depolymerization.

According to another embodiment of the present disclosure, there is provided a method of manufacturing a semiconductor device by performing a process on a substrate, the method including: obtaining a mixed solution by mixing a first liquid for forming a polymer film having a urea bond on the substrate and a second liquid that reacts with the first liquid inside a liquid flow path; forming the polymer film on a surface of the substrate by supplying the mixed solution to the substrate from a nozzle part provided at an end portion of the liquid flow path; and removing the polymer film by a depolymerization, the polymer film being temporarily used in a process of manufacturing the semiconductor device.

According to another embodiment of the present disclosure, there is provided a non-transitory computer-readable storage medium storing a computer program used in a substrate processing apparatus for processing a substrate to manufacture a semiconductor device, wherein the computer program includes a group of steps for causing the substrate processing apparatus to execute the aforementioned method.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 16A to 16C are experimental results showing a process in which polyurea is produced in a mixed solution.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
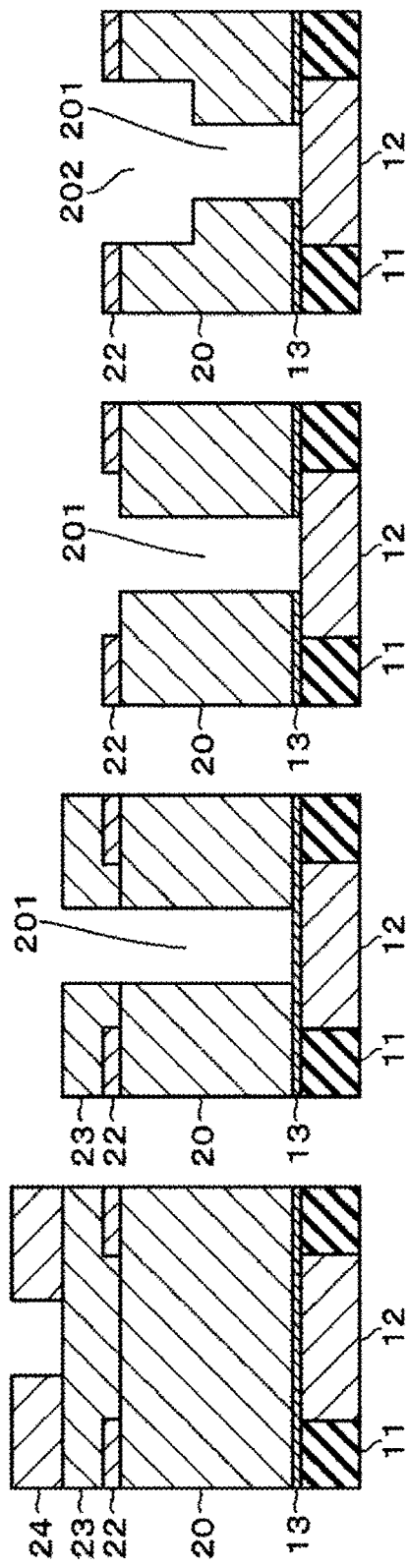
FIGS. 1A to 1D are explanatory views showing a semiconductor device manufacturing method which uses a sacrificial film made of a polymer having a urea bond.

Prior to describing a specific structure of a polyurea film forming module 8 as a substrate processing apparatus according to an embodiment of the present disclosure, descriptions will be made on some examples of a process of manufacturing a semiconductor device using a polymer film made of a polymer having a urea bond (hereinafter also referred to as a "polyurea film"), which has not been adopted in the past. As a first example, FIG. 1 shows an example in which a polyurea film is used as a sacrificial film at the time of etching a porous low dielectric constant film 20.

Reference numeral 11 in FIG. 1A denotes an underlying interlayer insulating film, reference numeral 12 denotes a wiring material embedded in the underlying interlayer insulating film 11, and reference numeral 13 denotes an etching stopper film having a function of a stopper at the time of etching. The etching stopper film 13 is formed of, for example, SiC (silicon carbide), SiCN (silicon carbonitride), or the like.

A low dielectric constant film 20 as an interlayer insulating film is formed on the etching stopper film 13. In this embodiment, a SiOC film is used as the low dielectric constant film 20. The SiOC film is formed by, for example, a CVD (Chemical Vapor Deposition) method which plasmarizes DEMS (diethoxymethylsilane). Accordingly, the low dielectric constant film 20 contains silicon, carbon and oxygen as main components. For example, a SiOC film is also used as the underlying interlayer insulating film 11.

In this embodiment, descriptions will be made on a case where a via hole 201 and a trench (groove for burying a wiring therein) 202 are formed in the low dielectric constant film 20 which constitutes a semiconductor device under manufacture, which is formed on a surface of a wafer W as a substrate. Referring to FIG. 1A, a hard mask 22, which is an etching-purpose pattern mask formed of, for example, a TiN (titanium nitride) film opened at a portion corresponding to the trench 202, is formed on the aforementioned low dielectric constant film 20.

A polyurea film 23 used as a sacrificial film when etching a via hole is formed on both the hard mask 22 and the low dielectric constant film 20. The polyurea film 23 is formed by supplying a mixed solution containing polyurea raw materials (amine and isocyanate) to the surface of the wafer W using the polyurea film forming module 8 (to be described later). A mask film 24 made of a $SiO_2$ (silicon oxide) film is formed on the polyurea film 23. The mask film 24 is patterned so that the portion corresponding to the via hole is opened.

Using the mask film 24 as a mask, the polyurea film 23 is etched by plasma of, for example, a $CH_3F$ gas, in the wafer W on which the above-described laminated structure is formed. Subsequently, the mask film 24 is removed by plasma of an oxygen gas. Then, the low dielectric constant film 20 is etched by plasma of, for example, a $C_6F_6$ gas, using the polyurea film 23 as an etching mask, whereby the via hole 201 is formed in the low dielectric constant film 20 (FIG. 1B).

Thereafter, the etching stopper film 13 at the bottom of the via hole 201 is etched by plasma ($CF_4$ gas plasma in the case of a SiC film). In the respective processes described above, it is required that the processes carried out up to this stage are performed at a temperature lower than a temperature at which polyurea is depolymerized.

Subsequently, the polyurea film 23 used as a sacrificial film is removed (FIG. 1C). As will be described later, the polyurea film 23 can be depolymerized into amine and can be evaporated by heating.

Similarly, like in the process of forming the via hole 201, the low dielectric constant film 20 is etched using the hard mask 22, whereby the trench 202 can be formed in a region surrounding the via hole 201 (FIG. 1D). Thereafter, the hard mask 22 is removed by wet etching using an etching solution obtained by mixing sulfuric acid, hydrogen peroxide water, and water. Then, copper is embedded in the via hole 201 and the trench 202, and excess copper is removed by CMP (Chemical Mechanical Polishing), whereby a copper wiring can be formed.

Figure 2:
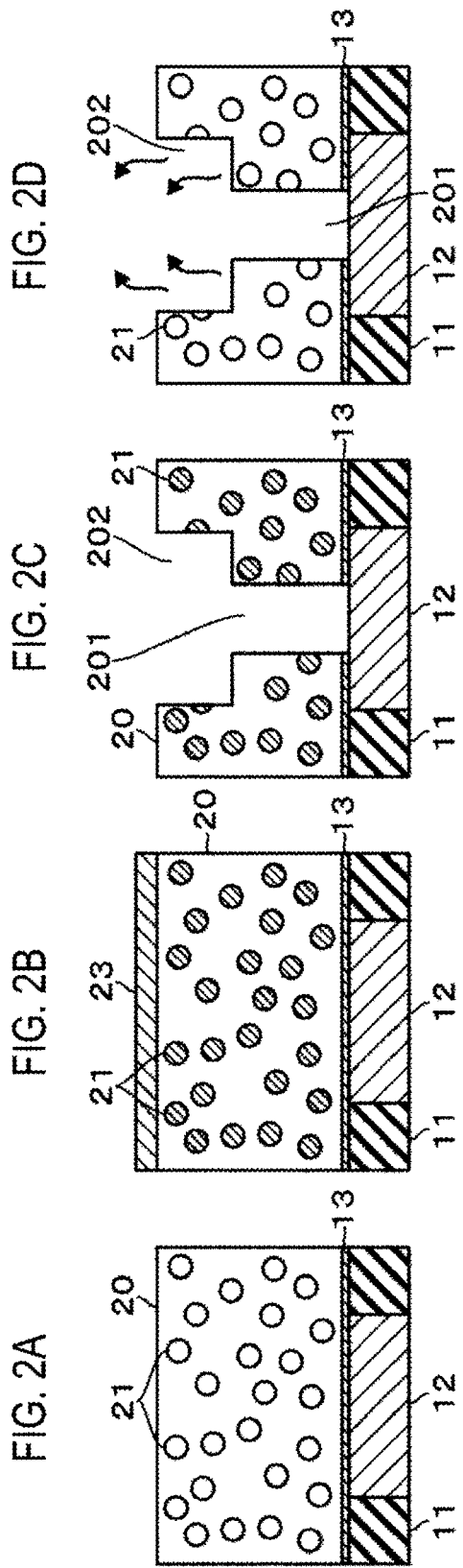
FIGS. 2A to 2D are explanatory views showing a semiconductor device manufacturing method, in which a polymer having a urea bond is temporarily embedded in a low dielectric constant film.

Next, a second example will be described with reference to FIG. 2. In the second example, polyurea is used as a material to be embedded in a large number of pores 21 formed in the porous low dielectric constant film 20. In FIGS. 2A to 2D, components similar to those described with reference to FIGS. 1A to 1D are denoted by the same reference numerals as those used in FIGS. 1A to 1D.

In FIG. 2A, like in the example described with reference to FIG. 1A, there is shown a state in which the low dielectric constant film 20 is laminated on the underlying interlayer insulating film 11 and the wiring material 12 with the etching stopper film 13 formed between the underlying interlayer insulating film 11 and the wiring material 12. A state in which the large number of pores 21 is formed in the low dielectric constant film 20 is shown extremely schematically.

When a mixed solution containing polyurea raw materials (amine and isocyanate) is supplied to the wafer W on which the low dielectric constant film 20 is formed, the mixed solution permeates into the low dielectric constant film 20. Then, the mixed solution is cured, thus causing a state in which polyurea is embedded (FIG. 2B). The polyurea film 23 formed by the mixed solution which is cured on the surface of the low dielectric constant film 20 without penetrating into the low dielectric constant film 20 may be depolymerized and removed by heating, or may be used as a sacrificial film similarly to the example described with reference to FIGS. 1A to 1D. In this example, the process of embedding polyurea in the pores 21 formed in the low dielectric constant film 20 is also included in the process of forming the polyurea film (the process of forming the polymer film having a urea bond).

After polyurea is embedded in the pores 21, using the hard mask 22 and the mask film 24 described with reference to FIGS. 1A and 1B (also using the polyurea film 23 when the polyurea film 23 is used as a sacrificial film), the low dielectric constant film 20 is etched to form a via hole 201 and a trench 202, and the etching stopper film 13 exposed at the bottom of the trench 202 is removed (FIG. 2C). Even if various kinds of plasma or etchant make contact with the low dielectric constant film 20 when the low dielectric constant film 20, the hard mask 22 on the low dielectric constant film 20 and the mask film 24 are removed by etching, the low dielectric constant film 20 can be protected by the polyurea embedded in the pores 21.

After the via hole 201 and the trench 202 are formed in the low dielectric constant film 20 in this way, the wafer W is heated to depolymerize and remove the polyurea embedded in the pores 21 of the low dielectric constant film 20 (FIG. 2D). The process of forming the copper wiring in the low dielectric constant film 20 returned to the porous film after removing the polyurea is the same as the example of the laminated structure described with reference to FIG. 1D.

In the above, an example of a process for manufacturing a semiconductor device by newly using a polyurea film has been described with reference to FIGS. 1A to 2D. In addition, the polyurea film may be temporarily used for the purpose of forming an embedded portion for protecting the low dielectric constant film 20 by being embedded in the via hole 201 or the trench 202 at the time of removal of the hard mask 22 shown in FIG. 1D, or for the purpose of forming a mask for protecting other regions when ion implantation is performed on a fin type FET (Field Effect Transistor).

Figure 3:
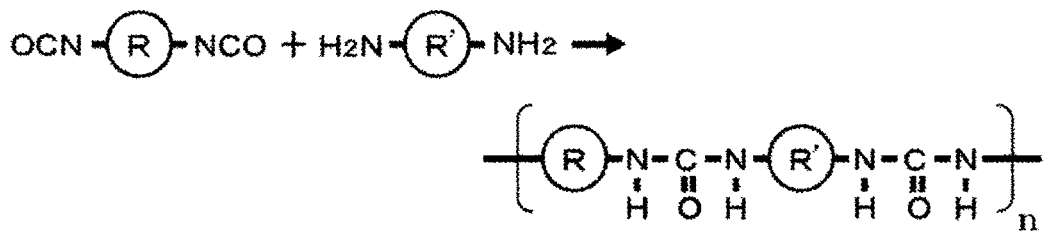
FIG. 3 is an explanatory view showing how a polymer having a urea bond is produced by a copolymerization reaction.
Figure 4A:
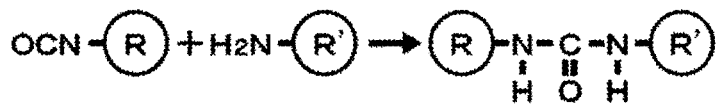
FIGS. 4A to 4D are explanatory views showing reactions in which a polymer having a urea bond becomes an oligomer.
Figure 4B:
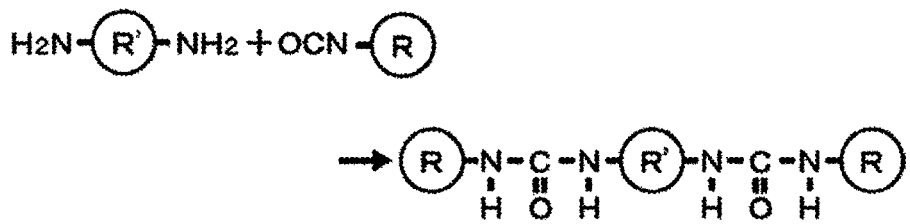
Figure 4C:
Figure 4D:
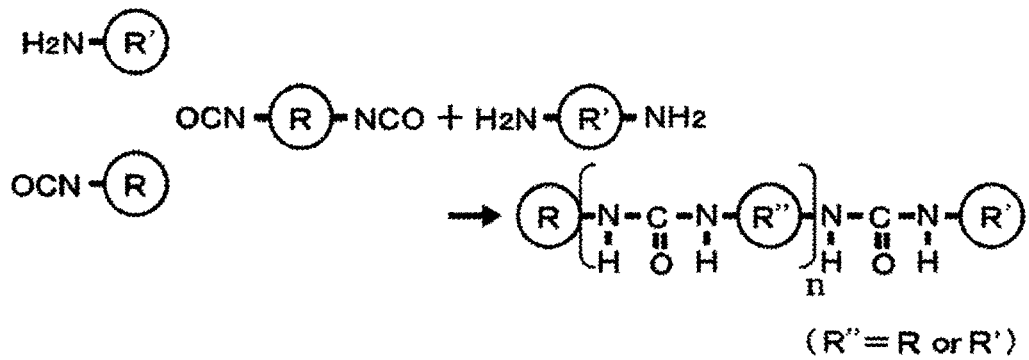

Next, an example of the polyurea for forming the polyurea film 23 will be described with reference to FIGS. 3 to 5B. For example, as shown in FIG. 3, polyurea can be produced by copolymerization using isocyanate and amine. R or R' (substituent) is, for example, an alkyl group (linear alkyl group or cyclic alkyl group) or an aryl group, and n is an integer of 2 or more.

As the isocyanate, for example, an alicyclic compound, an aliphatic compound, an aromatic compound or the like may be used. An example of the alicyclic compound may include 1,3-bis(isocyanate methyl)cyclohexane (H6XDI), and an example of the aliphatic compound may include hexamethylene diisocyanate. As the amine, for example, an alicyclic compound or an aliphatic compound may be used. An example of the alicyclic compound may include 1,3-bis (aminomethyl)cyclohexane (H6XDA), and an example of the aliphatic compound may include 1,12-diaminododecane (DAD).

Figure 5A:
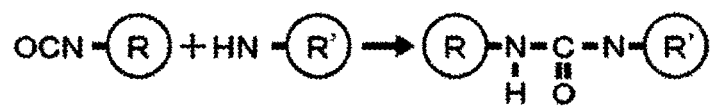
FIGS. 5A and 5B are explanatory views showing how a polymer having a urea bond is produced by using a secondary amine.
Figure 5B:
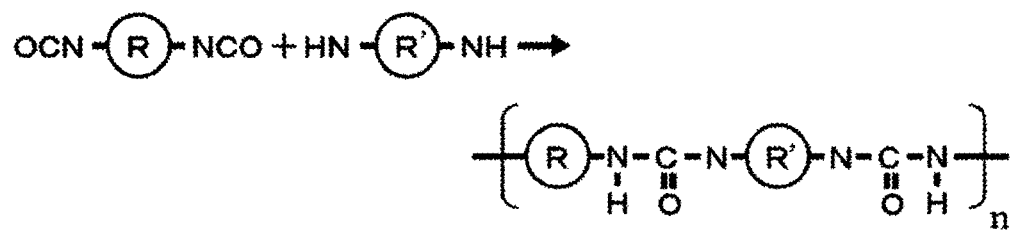

Next, variations of the reaction between isocyanate and amine will be described. In these reactions, as shown in FIGS. 4A to 4D, mono-functional molecules may be used as raw material monomers. Furthermore, as shown in FIGS. 5A and 5B, isocyanate and secondary amine may be used. In this case, the bond contained in the polymer is also a urea bond. Thus, polyurea is obtained.

The polyurea mentioned above can be depolymerized into amine and evaporated by heating, and can be removed from the semiconductor device under manufacture. In order not to adversely affect an element portion, particularly the copper wiring, which has already been formed on the wafer W, it is preferable to heat the polyurea at less than 400 degrees C., for example 390 degrees C. or less, specifically 300 to 350 degrees C.

The time for depolymerizing polyurea, for example, the time for heating polyurea at 300 degrees C. to 400 degrees C. may be, for example, 5 minutes or less, from the viewpoint of suppressing thermal damage to the element. Therefore, specific examples of the heating recipe may include 350 degrees C. and 5 minutes or less. As a heating method, an infrared lamp may be used, or a wafer W may heated by being mounting the wafer W on a mounting table including a built-in heater. The heating atmosphere is, for example, an inert gas atmosphere such as a nitrogen gas atmosphere or the like.

In this way, polyurea can be depolymerized merely by heating and can be removed by evaporation. Therefore, it is possible to easily remove polyurea as compared to the case of exposing a semiconductor device under manufacture to etching gas plasma or an etching solution. Thus, it is less likely to cause damage to the materials constituting the semiconductor device.

Meanwhile, it is known that isocyanate and amine react with each other in a short period of time. In the case of forming the polyurea film 23 using a solution containing isocyanate or amine, the manner of supplying the solutions to the surface of the wafer W is important.

If isocyanate and amine are mixed in situ inside a pipe for supplying a polyurea raw material to the wafer W, polyurea is produced inside the pipe, which may cause clogging of the pipe. In this regard, it is also possible to consider a method in which a solution containing isocyanate and a solution containing amine are alternately supplied to the wafer W to bring isocyanate and amine into contact with each other on the surface of the wafer W. However, as shown in a comparative example described later, it was found that according to this method, it is difficult to control a film thickness of the polyurea film 23 and to form the polyurea film 23 having a uniform thickness in the plane of the wafer W.

Therefore, in this example, a solution (first solution) containing isocyanate and solvent and a solution (second solution) containing amine and solvent are mixed inside a nozzle pipe (liquid flow path) 861. A mixed solution thus obtained is supplied to the wafer W. It was found that by this method, the polyurea film 23 having good film thickness controllability and uniform thickness can be formed while suppressing the occurrence of clogging of the nozzle pipe 861.

Next, a configuration example of the polyurea film forming module 8, which is a substrate processing apparatus for forming the polyurea film 23, will be described with reference to FIG. 6.

Figure 6:
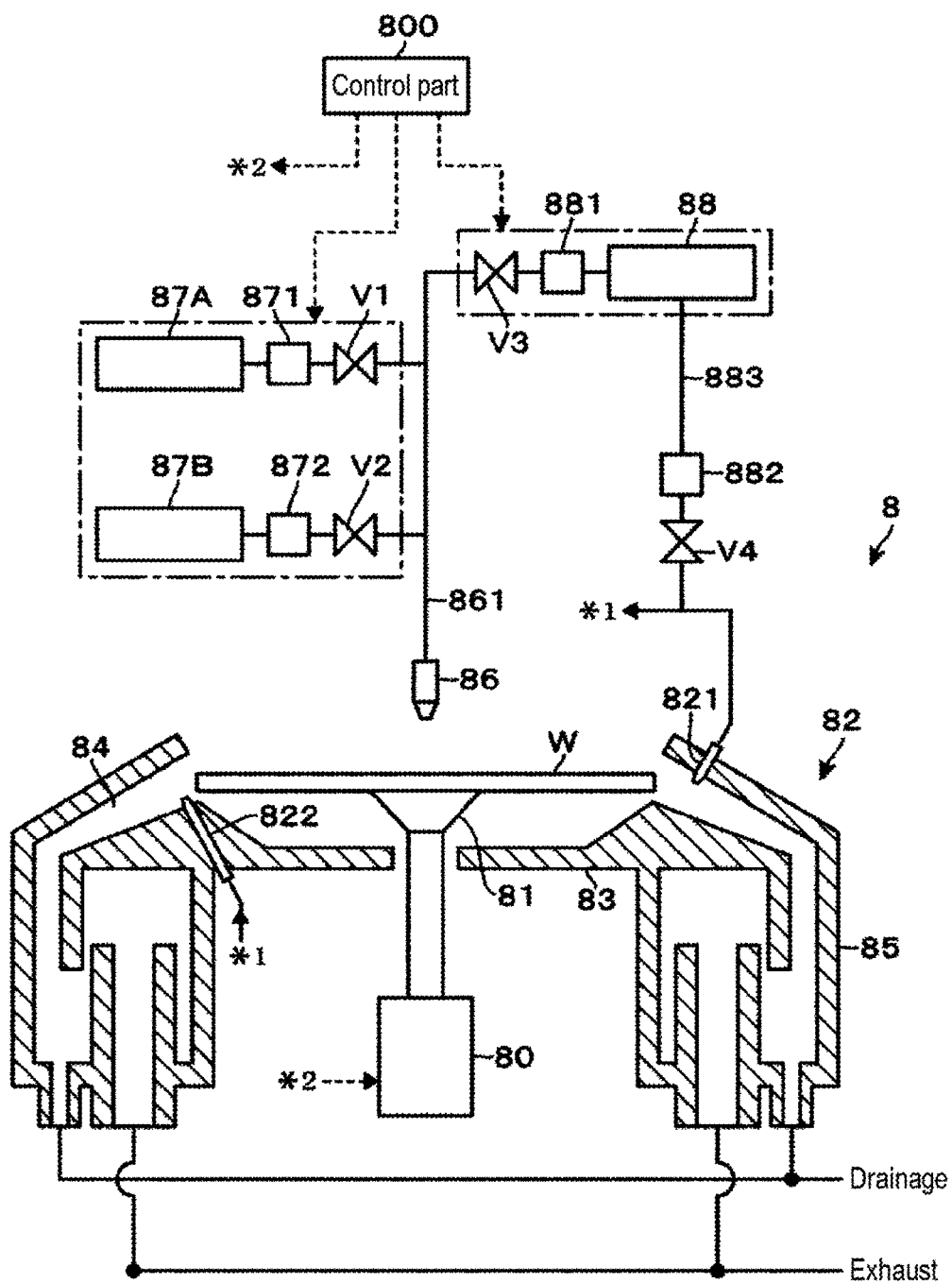
FIG. 6 is a vertical sectional side view of a polyurea film forming module according to an embodiment.

In FIG. 6, reference numeral 81 denotes a vacuum chuck which is a mounting table configured to adsorptively hold a wafer W and be rotated by a rotation mechanism 80. Reference numeral 82 denotes a cup module. Reference numeral 85 denotes an outer cup 83 which constitutes a main body of the cup module 82 and which has an annular groove for receiving liquid scattering from the rotating wafer W and discharging the liquid from a bottom side to the outside. Reference numeral 83 denotes a guide member formed in a tubular shape so as to extend an outer circumferential wall and an inner circumferential wall, which extend downward, toward the groove of the outer cup 85. Reference numeral 84 in FIG. 6 denotes a discharge space formed between the outer cup 85 and the outer circumferential wall so that exhaust and drainage can be performed over the entire circumference. The lower side of the discharge space 84 has a structure capable of gas-liquid separation. The outer cup 85 and the guide member 83 correspond to the cup of this example.

As shown in FIG. 6, a nozzle part 86 for supplying a solution (mixed solution to be described later) containing isocyanate and amine, which are raw materials of the polyurea film 23, toward the wafer W, is disposed above the center of rotation of the wafer W held on the mounting table 81. For example, the nozzle part 86 is connected to a drive mechanism (not shown) so that the nozzle part 86 can freely move between a position above the center of the wafer W and a position outside the outer cup 85.

The nozzle part 86 is provided at the end portion of a nozzle pipe 861. An amine solution supply part (second liquid supply part) 87A and an isocyanate solution supply part (first liquid supply part) 87B are connected to an upstream side of the nozzle pie 861 via opening/closing valves V1 and V2 and flow rate adjustment parts 871 and 872, respectively.

The isocyanate solution supply part 87B includes a storage tank that stores an isocyanate solution as a first liquid containing the above-described isocyanate serving as a polyurea raw material and a solvent, a forcibly-feeding mechanism for forcibly feeding the isocyanate solution stored in the storage tank by an inert gas such as a nitrogen gas or the like, and so forth.

The solvent that dissolves isocyanate may include a ketone group-containing solvent such as acetone, methyl ethyl ketone or the like. In addition, the solvent may be a hydrocarbon-based solvent such as normal hexane, cyclohexane or the like, an aromatic solvent such as toluene or the like, an alcohol-based solvent such as ethanol, propanol or the like, and so forth. A concentration of isocyanate in the isocyanate solution may be, for example, a concentration falling within a range of 1 to 40 wt %.

Meanwhile, the amine solution supply part 87A includes a storage tank that stores an amine solution as a second liquid containing the above-described amine serving as a polyurea raw material and a solvent, a forcibly-feeding mechanism for forcibly feeding the amine solution by an inert gas such as a nitrogen gas or the like, and so forth. The solvent that dissolves amine and a concentration of amine in the amine solution are the same as those in the case of the isocyanate solution. Therefore, the description thereof will be omitted.

As shown in the experimental results of the reference examples which will be described later, the present inventors has found that if an isocyanate solution obtained immediately after mixing isocyanate with a solvent (immediately after preparation) and an amine solution obtained immediately after mixing amine with a solvent (immediately after preparation) are mixed with each other, polyurea may be formed and solidified immediately after mixing, even though isocyanate and amine are diluted with the respective solvents.

On the contrary, in the isocyanate solution and the amine solution after 60 minutes or more from the preparation, the formation of polyurea immediately after mixing was not confirmed. A phenomenon that polyurea is produced slowly over time and is in a white turbid state, was observed.

Therefore, in the polyurea film forming module 8 of this embodiment, the isocyanate solution and the amine solution respectively stored in the isocyanate solution supply part 87B and the amine solution supply part 87A are used after a time lapse of 60 minutes or more since mixing with the solvent. Then, these isocyanate solution and amine solution are supplied to the nozzle pipe 861 to obtain a mixed solution of these solutions inside the nozzle pipe 861. As a result, it is possible to suppress the progress of generation of polyurea in a short period of time during which the clogging of the nozzle pipe 861 occurs.

Further, a solvent supply part 88 that supplies a diluting solvent for adjusting a concentration of the mixed solution supplied to the wafer W is coupled to the nozzle pipe 861 of this example via an opening/closing valve V3 and a flow rate adjustment part 881 at an upstream side of a position at which the nozzle pipe 861 is connected to the amine solution supply part 87A or the isocyanate solution supply part 87B. A storage tank that stores a solvent for adjusting the concentration of isocyanate or amine in the mixed solution, a pump for feeding the solvent in the storage tank, and the like are provided in the solvent supply part 88.

The diluting solvent supplied from the solvent supply part 88 may be the same as the solvent in the isocyanate solution and the amine solution or may be different from the solvent in these solutions, as long as it can be mixed with the mixed solution (a mixture of the isocyanate solution and the amine solution) inside the nozzle pipe 861.

In addition, in the polyurea film forming module 8 of this embodiment, a cleaning solvent pipe 883 different from the above-described nozzle pipe 861 is connected to the above-described solvent supply part 88. Cleaning solvent nozzles 821 and 822 are coupled to the cleaning solvent pipe 883 via a flow rate adjustment part 882 and an opening/closing valve V4. The cleaning solvent nozzles 821 and 822 serve to supply the solvent inside the solvent supply part 88 as a cleaning solvent for cleaning and removing the mixed solution adhering to the inside of the cup module 82.

As shown in FIG. 6, the cleaning solvent nozzle 821 supplies the cleaning solution toward an upper surface of the guide member 83 positioned outside the wafer W held by the mounting table 81. On the other hand, the cleaning solvent nozzle 822 supplies the cleaning solution toward an inner wall surface of the outer cup 85.

The cleaning solvent nozzles 821 and 822 are provided at plural positions at intervals along the circumferential direction of the cup module 82. With this configuration, the cleaning solvent supplied from the cleaning solvent nozzles 821 and 822 can be uniformly supplied to the upper surface of the guide member 83 and the inner wall surface of the outer cup 85, thereby cleaning these areas.

A control part 800 is provided in the polyurea film forming module 8 configured as above. The control part 800 is configured as a computer including a storage medium for storing a program and a CPU. The program includes commands (a group of steps) for sending a control signal from the control part 800 to each part of the polyurea film forming module 8 to execute a process of forming the polyurea film 23 on the surface of a wafer W.

More specifically, the control part 800 performs necessary operations for various kinds of control such as the number of rotations per unit time of the wafer W, the horizontal and vertical movement of the nozzle part 86, the supply and cutoff of the isocyanate solution, the amine solution and the solvents (the diluting solvent and the cleaning solvent) to the nozzle part 86 and cleaning solvent nozzles 821 and 822, the flow rate adjustment thereof, and the like. This program is stored in a storage medium such as, for example, a hard disk, a compact disk, a magneto-optical disk or a memory card.

In particular, as shown in the following Table 1, for example, the control part 800 of this embodiment stores the correspondence relationship between the film thickness of the polyurea film 23 and the respective supply flow rates of the isocyanate solution, the amine solution and the diluting solvent in the storage medium. As shown in experimental results of Examples described later, it was found that it is possible to change the film thickness of the polyurea film 23 formed on the surface of the wafer W according to the weight of the mixed solution adhering to the wafer W.

That is to say, in a state in which the number of rotations of the wafer W is kept constant, the flow rate of the mixed solution (including the case where the solution is diluted with the diluting solvent) supplied to the wafer W from the nozzle part 86, and the concentration of isocyanate or amine in the mixed solution are parameters for determining the film thickness of the polyurea film 23.

In the polyurea film forming module 8 of this embodiment, when an operator selects a target film thickness of the polyurea film 23 to be formed on the wafer W through the use of an interface such as a touch panel or the like, the flow rates of the respective solutions and the diluting solvent are read in the recipe setting the operating conditions of the polyurea film forming module 8 based on the correspondence relationship in Table 1. The flow rates in the flow rate adjustment parts 872, 871 and 881 are set on the basis of this recipe. In this respect, the control part 800 has a function of a flow rate setting part of this embodiment.

TABLE 1

| Target thickness of polyurea film | Supply flow rate of isocyanate solution | Supply flow rate of amine solution | Supply flow rate of diluting solution |
|---|---|---|---|
| 0.3 μm | A1 ml/min | B1 ml/min | C1 ml/min |
| 0.7 μm | A2 ml/min | B2 ml/min | C2 ml/min |
| 1.0 μm | A3 ml/min | B3 ml/min | C3 ml/min |

Figure 7:
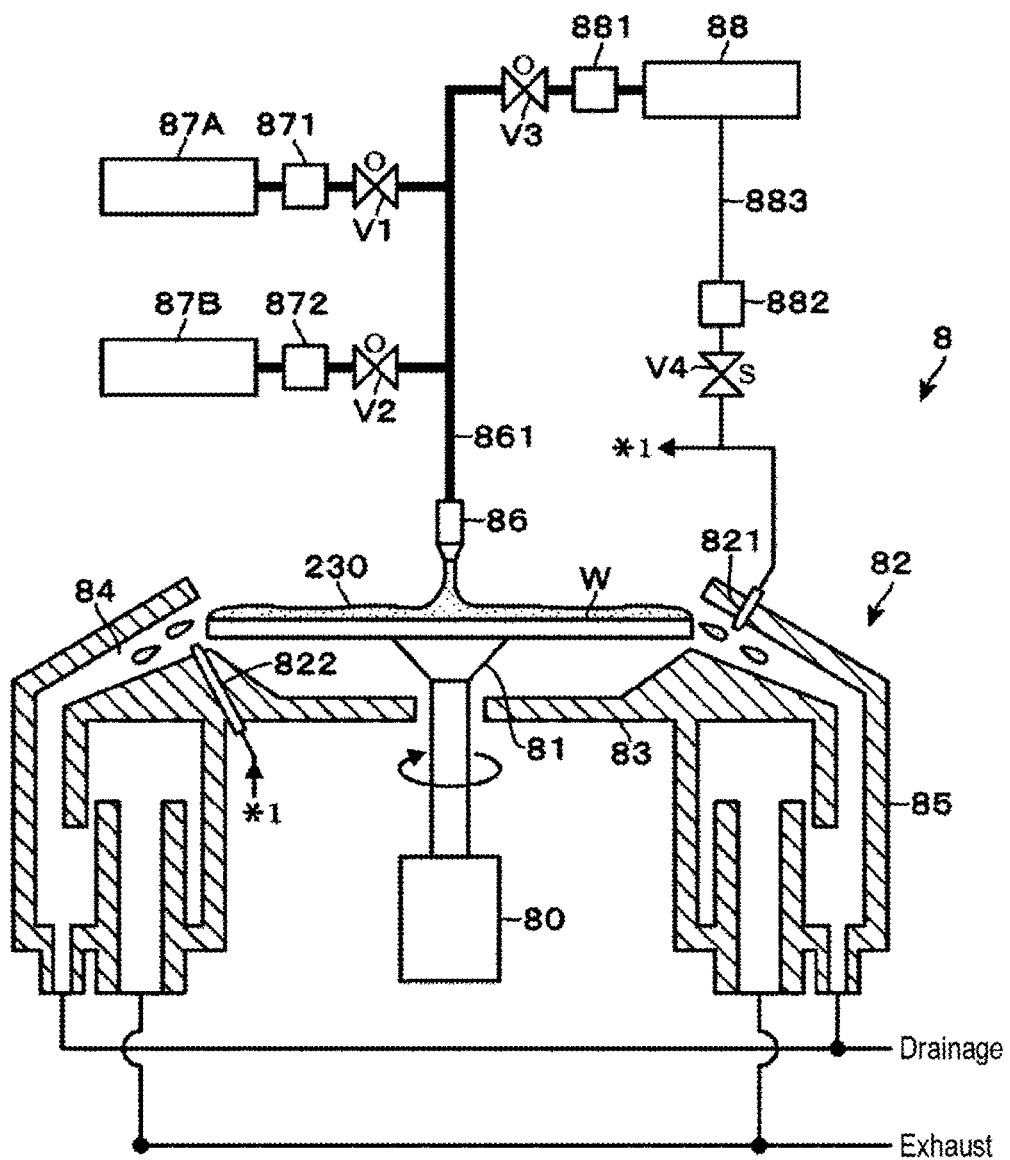
FIG. 7 is a first operation view of the polyurea film forming module.

Hereinafter, the operation of the polyurea film forming module 8 configured as above will be described with reference to FIGS. 7 and 8.

First, the wafer W to be processed is loaded into a housing in which the polyurea film forming module 8 is disposed, using an external wafer transfer mechanism, and is transferred to the mounting table 81. Thereafter, the nozzle part 86 is moved above the center of the wafer W, and the wafer W is rotated.

When the wafer W reaches a predetermined number of rotations, an isocyanate solution and an amine solution are supplied from the isocyanate solution supply part 87B and the amine solution supply part 87A at the flow rates previously read in the recipe. As a result, these solutions are mixed inside the nozzle pipe 861 to become a mixed solution, and are discharged toward the surface of the wafer W via the nozzle part 86. Further, when the setting is made so that the diluting solvent is supplied from the solvent supply part 88, the mixed solution whose concentration has been adjusted by using the diluting solvent is discharged toward the wafer W (FIG. 7).

At this time, it is preferable that the isocyanate solution and the amine solution supplied from the isocyanate solution supply part 87B and the amine solution supply part 87A are used after a time lapse of 60 minutes or more since the preparation thereof. This makes it possible to suppress the rapid formation of polyurea and to supply the raw materials of the polyurea film 23 to the surface of the wafer W in the mixed solution state without closing the nozzle pipe 861. However, when polyurea formation is slow due to reasons such as isocyanate and amine being sufficiently dilute, the use of the respective solutions elapsed less than 60 minutes after preparation is not prohibited.

The mixed solution supplied from the nozzle part 86 to the central portion of the wafer W receives a centrifugal force caused by the rotation of the wafer W and spreads over the entire surface of the wafer W. In the mixed solution covering the entire surface of the wafer W, the reaction between isocyanate and amine proceeds and the polyurea film 23 is formed. At this time, the solvent in the mixed solution is volatilized to raise the concentration of isocyanate and amine, whereby the rate of the reaction on the surface of the wafer W can be increased. After supplying the mixed solution for a predetermined period of time, the supply of the mixed solution is stopped.

After stopping the supply of the mixed solution, the number of rotations of the wafer W may be reduced or the rotation of the wafer W may be stopped so that the entire amount of the mixed solution is not spun off from the wafer W by the rotation of the wafer W.

On the other hand, a portion of the mixed solution supplied to the rotating wafer W is shaken away from the wafer W and adheres to the surface of the guide member 83 and the inner wall surface of the outer cup 85. Therefore, as shown in FIG. 8, the cleaning solvent is supplied to these surfaces from the cleaning solvent nozzles 821 and 822, whereby the mixed solution before being solidified into a film shape on these surfaces is dissolved again in the cleaning solvent and is discharged to the outside (FIG. 8).

When the isocyanate solution and the amine solution, which have been prepared as described above for 60 minutes or more, are used, polyurea formation slowly proceeds after mixing for about 10 minutes even after the solvent is volatilized. Therefore, in the polyurea film forming module 8 of this embodiment, before the lapse of 10 minutes after obtaining the mixed solution of the isocyanate solution and the amine solution mixed inside the nozzle pipe 861, the mixed solution adhering to the guide member 83 and the outer cup 85 is washed off with a sufficient amount of cleaning solvent.

By this cleaning, the adhesion of polyurea to the surfaces of the guide member 83 and the outer cup 85 constituting the cup module 82 can be suppressed, which makes it possible to suppress the occurrence of clogging of the flow path inside the cup module 82. The mixed solution diluted with a sufficient amount of solvent can maintain fluidity even when polyurea is formed. Therefore, after draining the mixed solution to a drainage flow path, there is no trouble in the feeding of the drained solution to a process tank where a drainage operation is performed.

Figure 8:
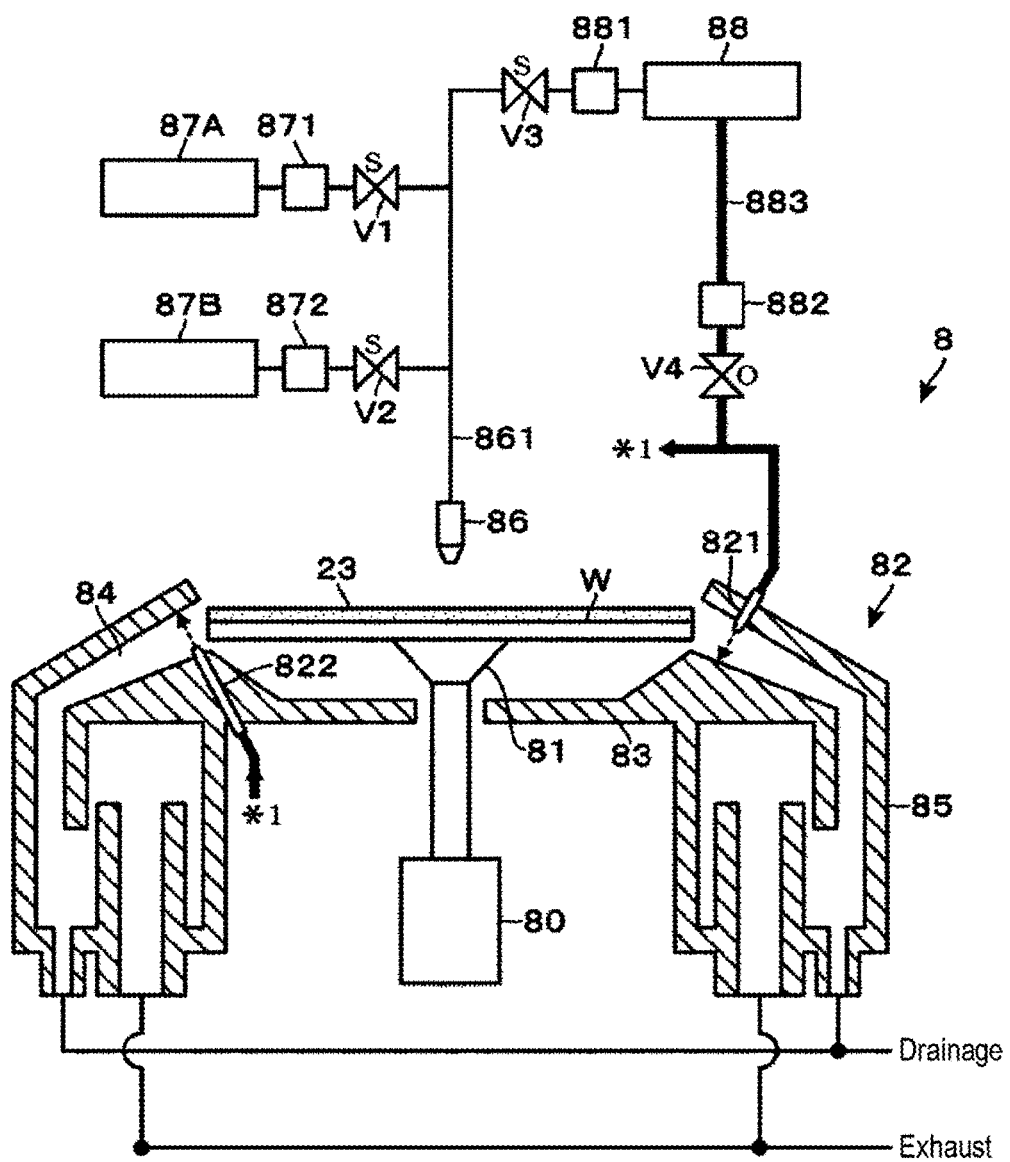
FIG. 8 is a second operation view of the polyurea film forming module.

FIG. 8 shows a state in which the cleaning solution is supplied from the cleaning solvent nozzles 821 and 822 while the wafer W on which the polyurea film 23 has been formed (or on which the polyurea film 23 is being formed) is held on the stopped mounting table 81. Unlike this example, after the rotation of the mounting table 81 is stopped, the wafer W may be unloaded from the polyurea film forming module 8 to the outside, and the cup module 82 may be cleaned by supplying the cleaning solution from the cleaning solvent nozzles 821 and 822 before the lapse of the above-mentioned 10 minutes.

After the nozzle part 86 used for supplying the mixed solution is moved to, for example, a standby position, only the solvent is caused to flow from the solvent supply part 88 to the nozzle pipe 861, thereby discharging and cleaning the mixed solution remaining in the nozzle pipe 861. This cleaning is also preferably performed within 10 minutes after obtaining the mixed solution inside the nozzle pipe 861.

If necessary, the film thickness of the polyurea film 23 is adjusted by heating the wafer W on which the polyurea film 23 is formed in this way (see the description of FIG. 2B). Thereafter, various processes (such as an etching process using plasma or etching solution, an ion implantation process and the like) are performed after forming the polyurea film 23.

The wafer W that has been processed using the polyurea film 23 is heated inside a heat treatment apparatus (not shown) at a temperature falling within a range of 300 degrees C. to 400 degrees C. to depolymerize the polyurea film 23, and the amine thus evaporated is exhausted.

The process of depolymerizing the polyurea film 23 may be performed using a single-wafer type heat treatment apparatus in which a wafer W is heated by mounting the wafer W on a mounting table provided with a heating part. It may also be possible to use a known vertical heat treatment apparatus in which a wafer boat configured to hold a large number of wafers W is carried into a quartz tube and the wafers W are heated by radiant heat using a heating part disposed around the quartz tube.

The polyurea film forming module 8 according to the present embodiment provides the following effects. The isocyanate solution and the amine solution respectively diluted with a solvent are mixed inside the nozzle pipe 861 and are then supplied to the wafer W. Therefore, the polyurea film 23 can be formed while adjusting the time until the polyurea is formed.

Figure 9:
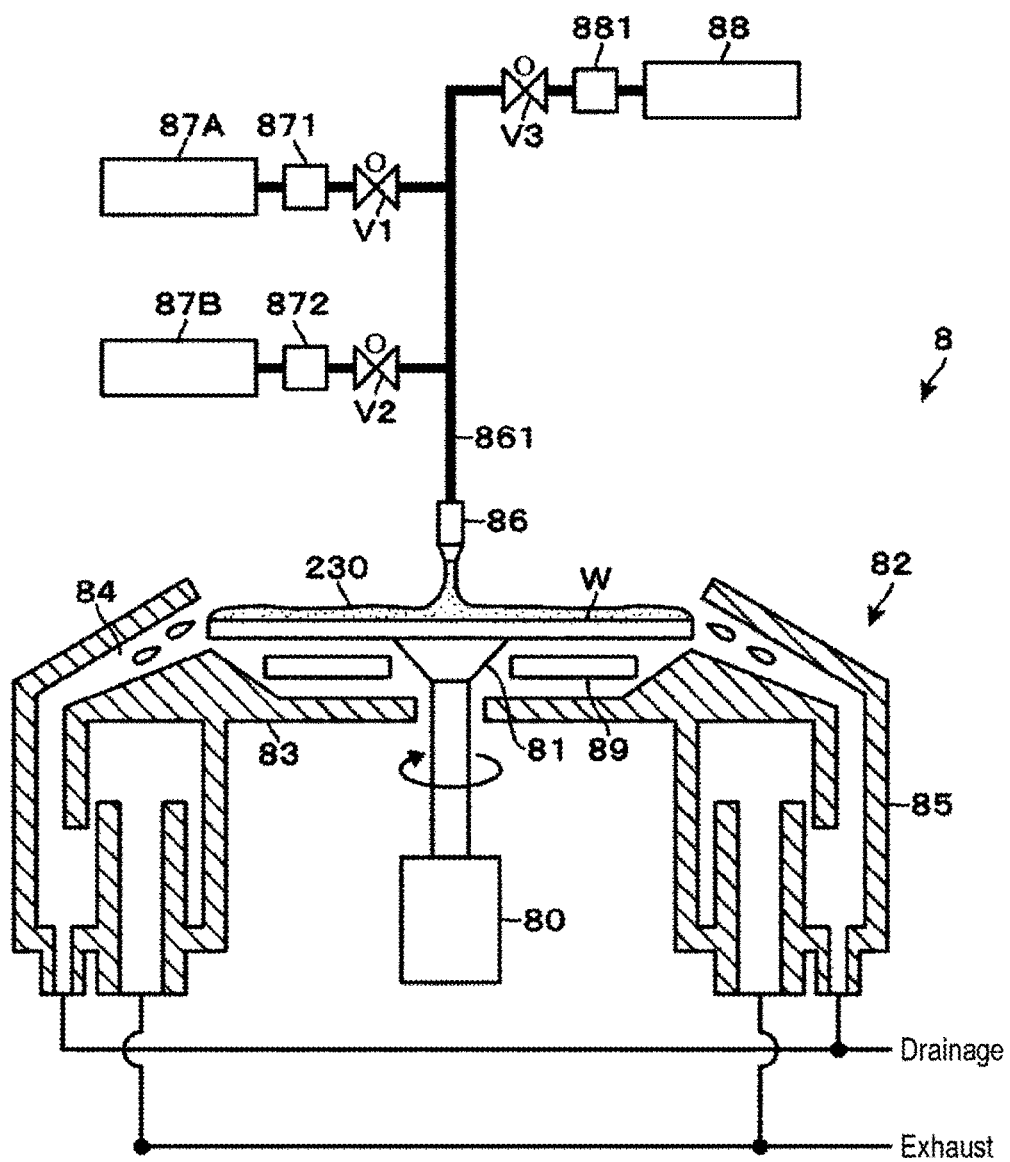
FIG. 9 is a first operation view of a polyurea film forming module according to another embodiment.
Figure 10:
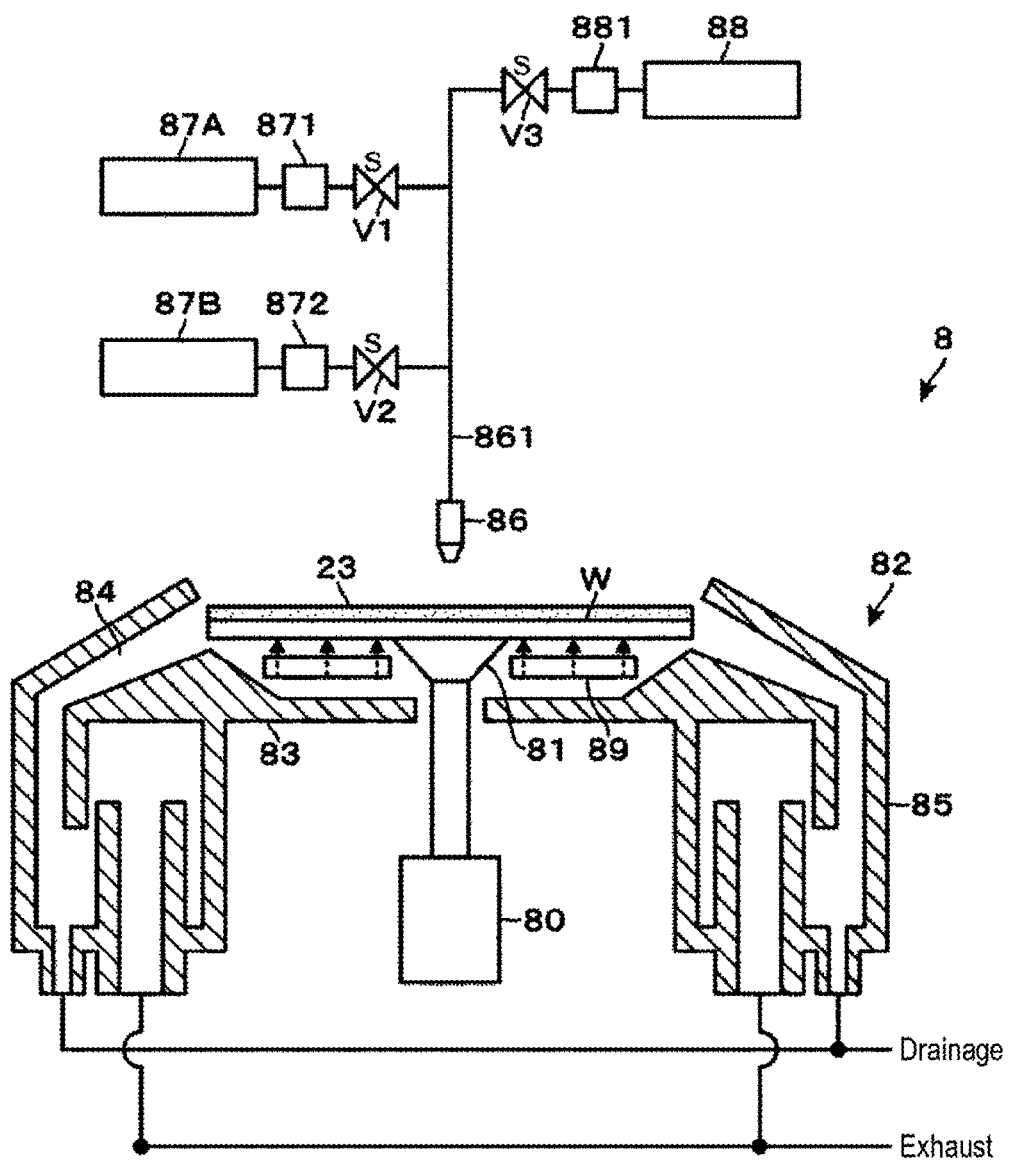
FIG. 10 is a second operation view of the polyurea film forming module according to another embodiment.
Figure 11:
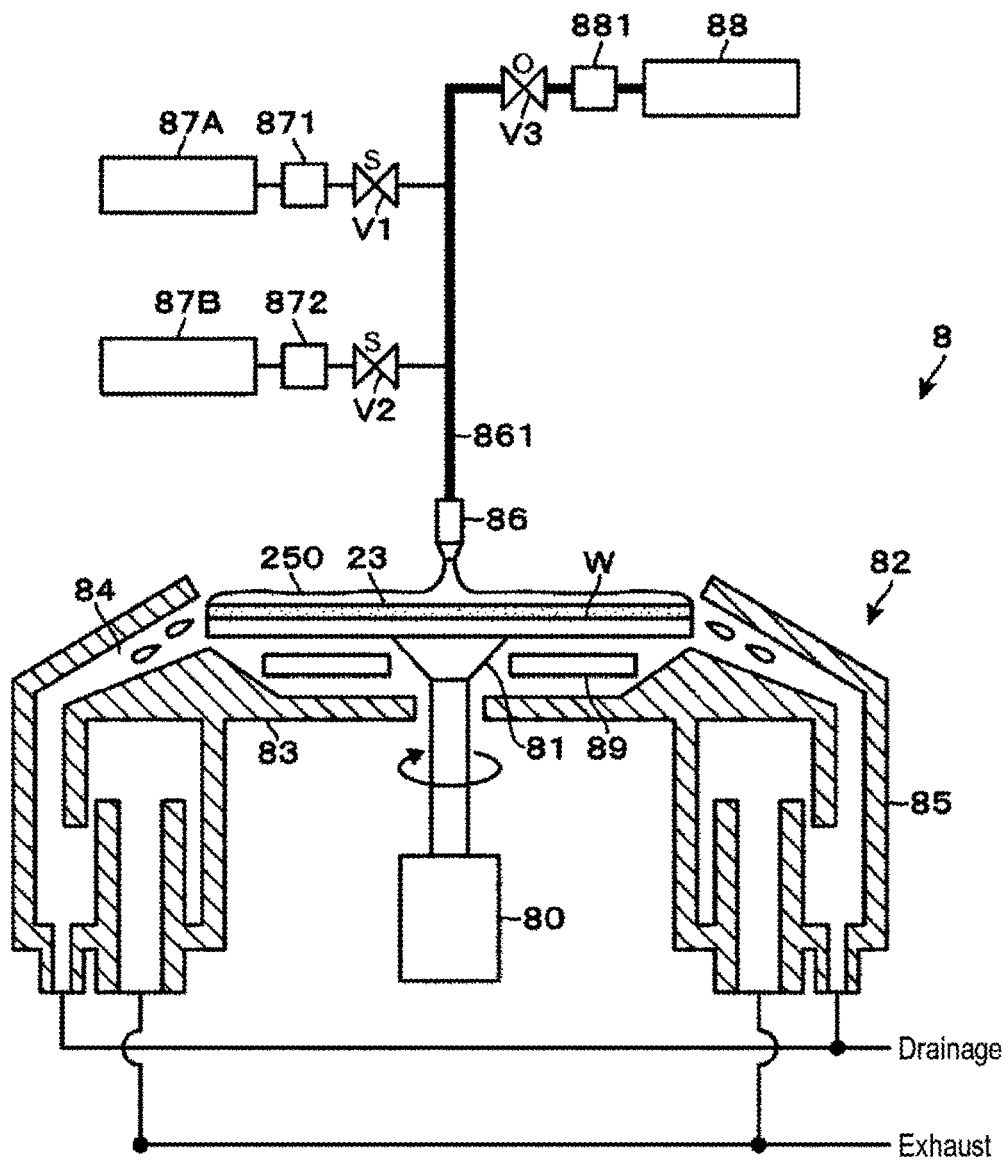
FIG. 11 is a third operation view of the polyurea film forming module according to another embodiment.

As shown in FIGS. 9 to 11, the polyurea film forming module 8 may be provided with a heating part. In these figures, there is shown an example in which, as the heating part, a heating LED (light emitting diode) 89 for heating the wafer W by irradiating infrared rays is provided below the wafer W held on the mounting table 81. In the case of using the heating part, it is possible to shorten the time from the supply of the mixed solution to the surface of the wafer W to the formation of the polyurea film 23.

Therefore, the cleaning solvent nozzles 821 and 822 described with reference to FIG. 6 or the like may be omitted. In this case, by supplying the mixed solution to the rotating wafer W from the nozzle part 86 (FIG. 9), stopping the supply of the mixed solution and then heating the wafer W using the heating LED 89, it is possible to form the polyurea film 23 in a short period of time. At this time, the number of rotations of the wafer W may be decreased or the rotation of the wafer W may be stopped. By using the heating LED 89 having a high directivity of infrared rays, it is possible to maintain a slow progression of polyurea formation with respect to the mixed solution scattering from the wafer W toward the cup module 82.

Thereafter, the wafer W on which the polyurea film 23 is formed is rotated, and a solvent is supplied alone to the surface of the wafer W via the nozzle part 86 (cleaning solvent 250 in FIG. 11). Since the polyurea film 23 on the wafer W is not dissolved in the solvent, the solvent supplied to the surface of the rotating wafer W scatters as it is. On the other hand, the mixed solution is soluble in the solvent at the aforementioned time point of 10 minutes or less. Therefore, it is possible to clean and remove the mixed solution adhering to the cup module 82 using the solvent scattering from the rotating wafer W (FIG. 11).

Figure 12:
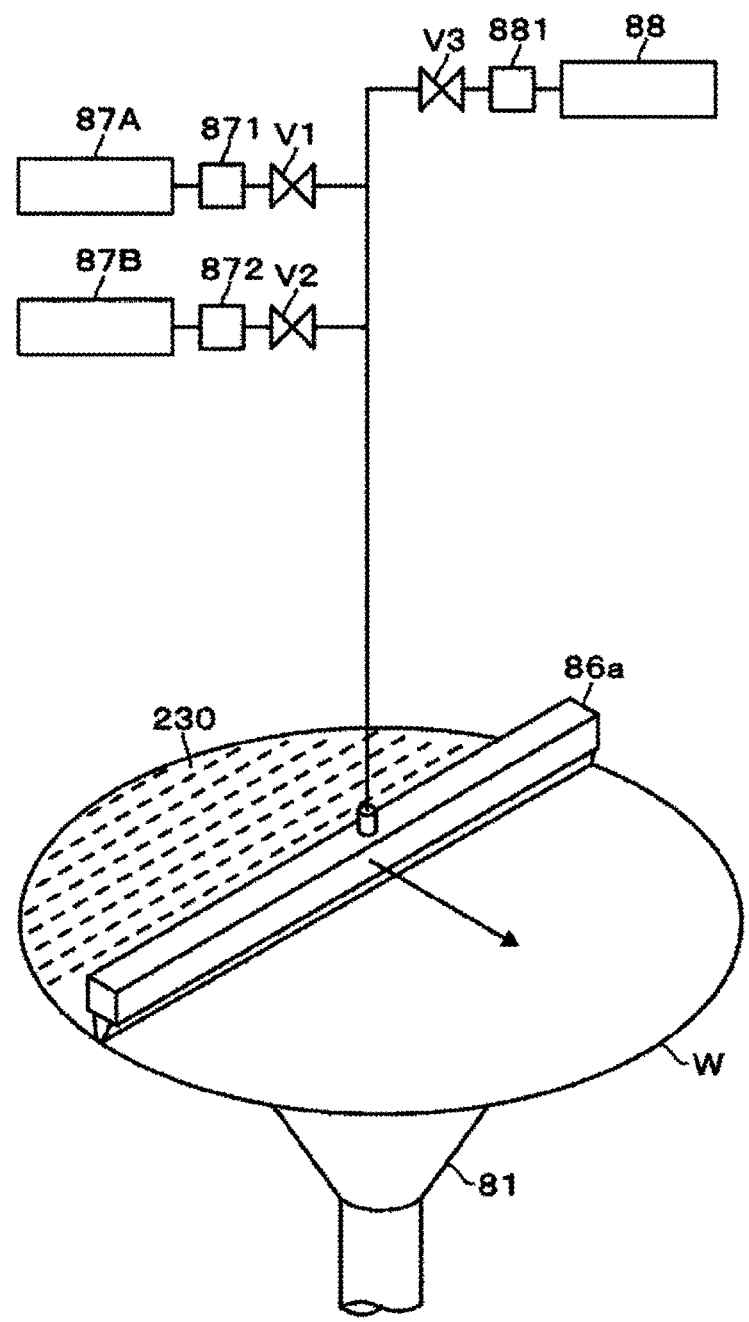
FIG. 12 is an explanatory view showing a modification of a nozzle part.

Further, the configuration of the nozzle part 86 for supplying the mixed solution 230 to the wafer W is not limited to the example shown in FIG. 6 and the like. For example, as shown in FIG. 12, a slit-shaped discharge port extending along the length direction of a rod-like scan nozzle part 86a may be provided on the bottom surface of the scan nozzle part 86a having a length approximately equal to the diameter of the wafer W. Alternatively, a plurality of small-diameter discharge holes may be provided side by side along the length direction of the scan nozzle part 86a.

Then, for example, as shown in FIG. 12, the nozzle part 86a for discharging the mixed solution 230 may be moved relative to the wafer W so as to scan the wafer W from one end side of the wafer W held on the mounting table 81 toward the other end side, thereby applying the mixed solution 230 to the entire surface of the wafer W. Alternatively, the scan nozzle part 86a may be disposed along the diameter of the wafer W. While discharging the mixed solution 230 from the scan nozzle part 86a, the wafer W and the scan nozzle part 86a may be rotated relative to each other about the center axis to apply the mixed solution 230 on the wafer W (respective illustration is omitted herein).

Figure 13:
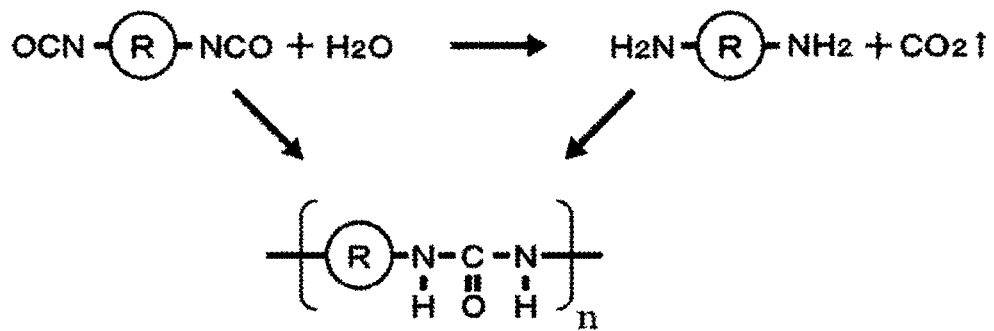
FIG. 13 is an explanatory view showing a reaction in which a polymer having a urea bond is produced by self-polymerization of isocyanate.

Next, a method of forming the polyurea film 23 using reactions other than the aforementioned copolymerization will be described. FIG. 13 shows a reaction in which polyurea is formed by self-polymerization of isocyanate. When moisture is added to isocyanate, amine is formed by hydrolysis. Polyurea can be obtained by the reaction of isocyanate and amine.

Figure 14:
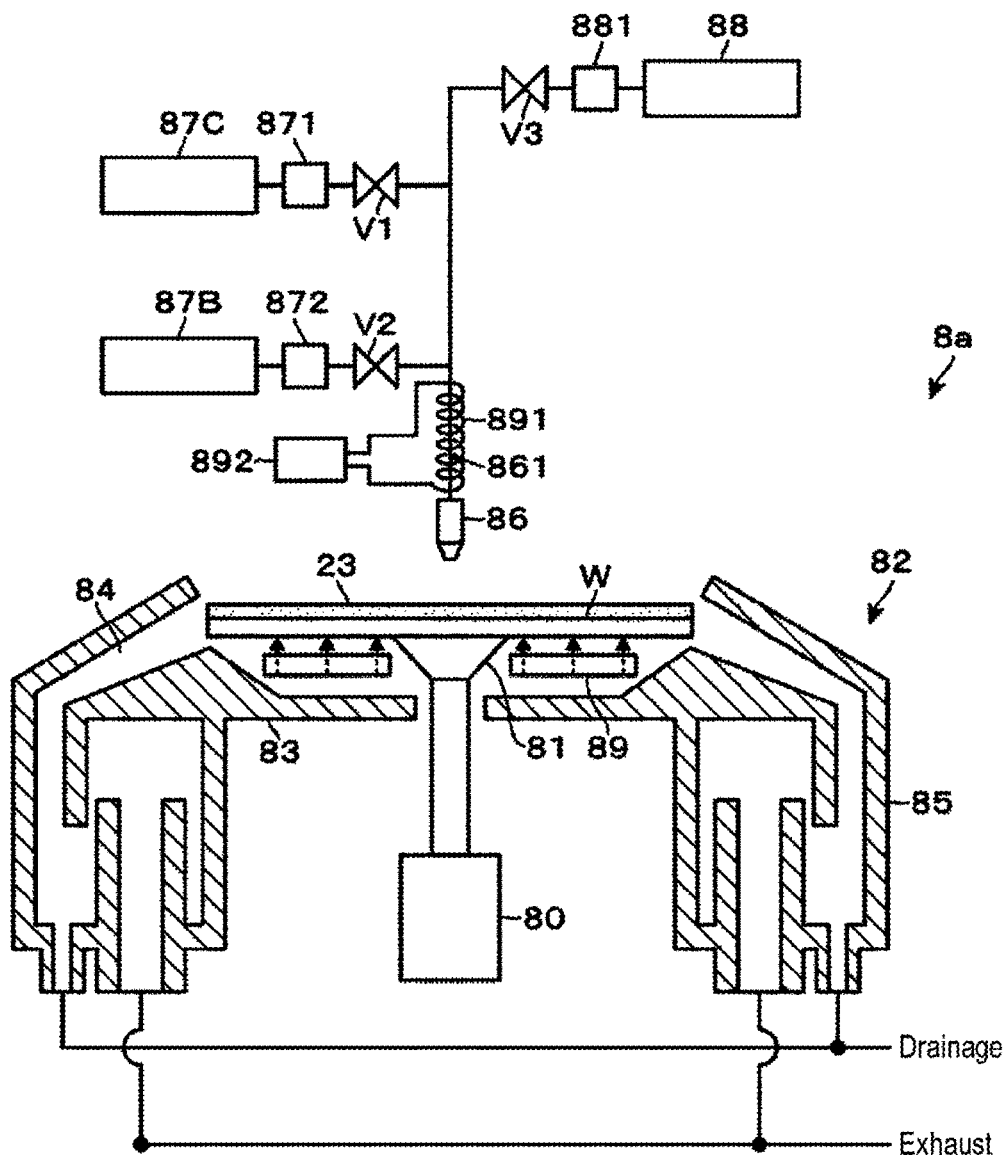
FIG. 14 is a configuration example of a polyurea film forming module which utilizes a self-polymerization.

FIG. 14 shows a configuration example of a polyurea film forming module 8a for forming a polyurea film 23 on a wafer W by utilizing the aforementioned self-polymerization. In FIG. 14, the same components as those of the polyurea film forming module 8 described with reference to FIG. 6, FIG. 9 and the like are denoted by the same reference numerals as used in FIG. 6, FIG. 9 and the like. In the polyurea film forming module 8a of this embodiment, an isocyanate solution containing isocyanate and a solvent (first liquid) is supplied from an isocyanate solution supply part (first liquid supply part) 87B in the same manner as in the polyurea film forming module 8 described above. For example, the concentration of isocyanate is adjusted to 1 to 40 wt %.

On the other hand, in the polyurea film forming module 8a of this embodiment, a moisture supply part (second liquid supply part) 87C is provided in place of the above-described amine solution supply part 87A. From the moisture supply part 87C, an aqueous acetone solution obtained by mixing water and acetone is supplied as a liquid (second liquid) containing moisture for promoting self-polymerization with respect to isocyanate. A case where the concentration of moisture in the aqueous acetone solution is adjusted to 0.1 to 10 wt % may be exemplified. This moisture concentration is adjusted so that the isocyanate necessary for self-polymerization remains together with the formation of amine by hydrolysis of isocyanate.

The moisture supply part 87C is the same as the isocyanate solution supply part 87B in that the moisture supply part 87C includes a storage tank for storing the aqueous acetone solution, a forcibly-feeding mechanism for forcibly feeding the acetone solution stored in the storage tank using an inert gas such as a nitrogen gas or the like, and so forth.

As compared with the copolymerization reaction accompanying the mixing of the isocyanate solution and the amine solution, the self-polymerization reaction accompanying the mixing of the isocyanate solution and the moisture (aqueous acetone solution) has a slow reaction rate. Therefore, for the purpose of promoting the progress of the self-polymerization reaction, the polyurea film forming module 8a is provided with a pipe heater 891 for heating the mixed solution flowing through the nozzle pipe 861 and a heating LED 89 for heating the wafer W held by the mounting table 81.

For example, the pipe heater 891 is constituted by a tape-heater including a resistance heating element and is wound around an outer surface of the nozzle pipe 861 at the downstream side of a position at which the isocyanate solution and the moisture are mixed. The pipe heater 891 is connected to a power supply part 892. Based on temperature data detected by a temperature detection part (not shown) provided in the nozzle pipe 861, power to be supplied to the pipe heater 891 is adjusted so that the detected temperature approaches a preset target temperature.

The target temperature of the nozzle pipe 861 is set so that a temperature of the mixed solution flowing through the nozzle pipe 861 falls within a range of 60 to 100 degrees C. The liquid stored in the nozzle pipe 861, the isocyanate solution supply part 87B and the moisture supply part 87C at a position above the nozzle part 86, namely at the upstream side of the mixing position of the isocyanate solution and the moisture may be heated. In addition, only the side of the nozzle part 86 may be heated as long as it is possible to heat the mixed solution to a desired temperature.

As shown in Reference Examples below, if isocyanate and alcohol are mixed under the temperature condition heated to about 60 to 100 degrees C. as described above, there is a possibility that alcohol reacts with the terminal of polyurea and self-polymerization stops. From this viewpoint, it is preferable that the solvent mixed with water used for self-polymerization, the solvent for isocyanate or the diluting solvent supplied from the solvent supply part 88 for adjusting the concentration is a solvent containing a ketone group such as acetone or methyl ethyl ketone.

If the mixed solution mixed in the nozzle pipe 861 is heated and then supplied to the surface of the rotating wafer W using the polyurea film forming module 8a having the above-described configuration, self-polymerization proceeds on the surface of the wafer W. Furthermore, by increasing the temperature of the wafer W to, for example, 250 degrees C. using the heating LED 89, it is possible to promote the progress of self-polymerization. As a result, the polyurea film 23 is formed on the surface of the wafer W. Even in the case of forming the polyurea film 23 by utilizing self-polymerization, the number of rotations of the wafer W may be decreased or the rotation of the wafer W may be stopped during the heating of the wafer W.

EXAMPLES

Experiment 1

The relationship between an elapsed time after the preparation of an isocyanate solution and an amine solution and the formation of polyurea after mixing these solutions was confirmed.
A. Experimental Condition Reference Example 1-1

H6XDI and acetone were mixed to prepare an isocyanate solution having a concentration of 10 wt %. In addition, an amine solution having a concentration of 10 wt % was prepared by mixing H6XDA and acetone. After a time elapse of 60 minutes from the preparation of the respective solutions, the isocyanate solution and the amine solution were mixed, and the state of the mixed solution immediately after the mixing was observed.

Reference Example 1-2

Figure 15A:
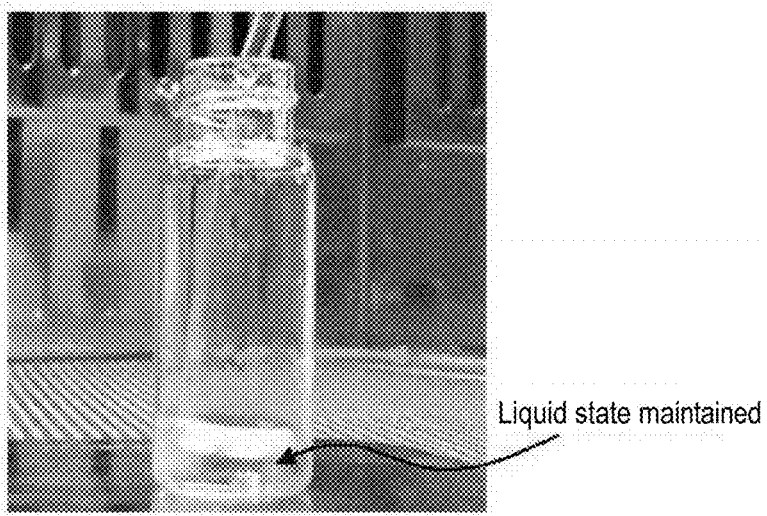
FIGS. 15A and 15B are experimental results showing the influence of an elapsed time after a mixed solution as a raw material of a polyurea film is prepared.
Figure 15B:
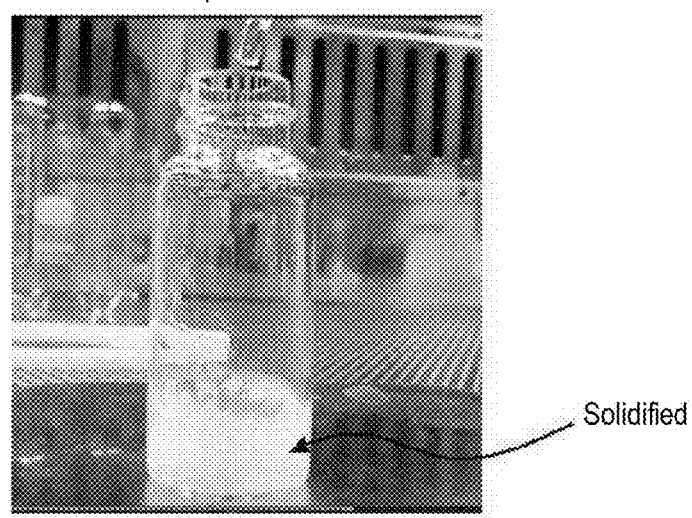

The same experiment as in Reference Example 1-1 was carried out except that the isocyanate solution and the amine solution were mixed immediately after preparing these solutions.
B. Experimental Result Appearance photographs of the mixed solutions according to Reference Examples 1-1 and 1-2 are shown in FIGS. 15A and 15B, respectively. According to the result of Reference Example 1-1 shown in FIG. 15A, in the mixed solution obtained by mixing the isocyanate solution and the amine solution after a time elapse of 60 minutes from the preparation of these solutions, rapid formation of polyurea was not observed and the mixed solution could be maintained in a liquid state (FIG. 15B).

On the other hand, according to the result of Reference Example 1-2, in the mixed solution obtained by mixing the isocyanate solution and the amine solution immediately after preparing these solutions, rapid formation of polyurea was observed immediately after the mixing and the mixed solution was almost solidified instantaneously.

From the experimental results of Reference Examples 1-1 and 1-2, it was found that the solutions after a time elapse of 60 minutes from the mixing of isocyanate and amine with respective solvents do not immediately cause formation of polyurea even if they are mixed, and has a little risk of clogging of the nozzle pipe 861 even if they are used in the polyurea film forming module 8.

Experiment 2

As for the mixed solution obtained in Reference Example 1-1, the state of polyurea formation with time was observed.
A. Experimental Condition Reference Examples 2-1, 2-2 and 2-3

Appearance observation was conducted for the respective mixed solutions after a time elapse of 10 minutes, 20 minutes and 30 minutes from the mixing.
B. Experimental Result Appearance photographs of the mixed solutions according to Reference Examples 2-1 to 2-3 are shown in FIGS. 16A to 16C, respectively. In Reference Example 2-1 in which 10 minutes has elapsed after mixing, the mixed solution maintained a transparent liquid state and no visible formation of polyurea was confirmed (FIG. 16A). Next, in Reference Example 2-2 in which 20 minutes has elapsed after mixing, it was confirmed that the mixed solution started to become slightly turbid and formation of polyurea began to proceed to a visible extent (FIG. 16B). Further, in Reference Example 2-3 in which 30 minutes has elapsed after mixing, the white turbidity of the mixed solution progressed considerably, but the mixed solution was still remained in a liquid state (FIG. 16C).

According to the results shown in Reference Examples 2-1 to 2-3 above, when the mixed solution is obtained using the isocyanate solution and the amine solution available after a time elapse of 60 minutes or more since the preparation thereof, if the mixed solution adhering to the cup module 82 is cleaned within 10 minutes since the mixing of the solutions and is discharged from the polyurea film forming module 8, it is possible to suppress the occurrence of clogging of the flow path inside the cup module 82.

Experiment 3

The influence of the difference between methods of coating a polyurea raw material on a substrate on a film thickness controllability of the polyurea film 23 and the like was investigated.

A. Experimental Condition

Example 3-1

Using a mixed solution obtained by mixing an isocyanate solution having a concentration of 1.0 wt % and an amine solution having a concentration of 1.0 wt %, which was prepared in the same manner as in Reference Example 1-1, the mixed solution of 500 μml was coated on the surface of an experimental silicon substrate rotating at 1,500 rpm to form a polyurea film 23. Thereafter, the thickness of the polyurea film 23 and the amount of polyurea adhering to the silicon substrate were measured.

Example 3-2

The same experiment as in Example 3-1 was carried out except that the concentrations of the isocyanate solution and the amine solution were changed to 2.0 wt %.

Example 3-3

The same experiment as in Example 3-1 was carried out except that the concentrations of the isocyanate solution and the amine solution were changed to 2.5 wt %.

Example 3-4

The same experiment as in Example 3-1 was carried out except that the concentrations of the isocyanate solution and the amine solution were changed to 5.0 wt %.

Example 3-5

The same experiment as in Example 3-1 was carried out except that the concentrations of the isocyanate solution and the amine solution were changed to 20 wt %.

Comparative Example 3-1

An isocyanate solution having a concentration of 0.1 wt % and an amine solution having a concentration of 0.1 wt % prepared in the same manner as in Reference Example 1-1 were respectively maintained alone without being mixed. After a time elapse of 60 minutes from the preparation of the solutions, 100 μml of isocyanate solution was supplied to and coated on the surface of the experimental silicon substrate rotating at 1,500 rpm, and then 100 μml of amine solution was supplied to and coated on the silicon substrate. The alternate coating of the isocyanate solution and the amine solution was repeated 10 times in total to form a polyurea film 23. Thereafter, the thickness of the polyurea film 23 and the amount of polyurea adhering to the silicon substrate were measured.

Comparative Example 3-2

The same experiment as in Comparative Example 3-1 was carried out except that the concentrations of the isocyanate solution and the amine solution were changed to 0.2 wt %.

Comparative Example 3-3

The same experiment as in Comparative Example 3-1 was carried out except that the concentrations of the isocyanate solution and the amine solution were changed to 0.5 wt %.

Comparative Example 3-4

The same experiment as Comparative Example 3-1 was carried out except that the concentrations of the isocyanate solution and the amine solution were changed to 5.0 wt %.

B. Experimental Result

Figure 17A:
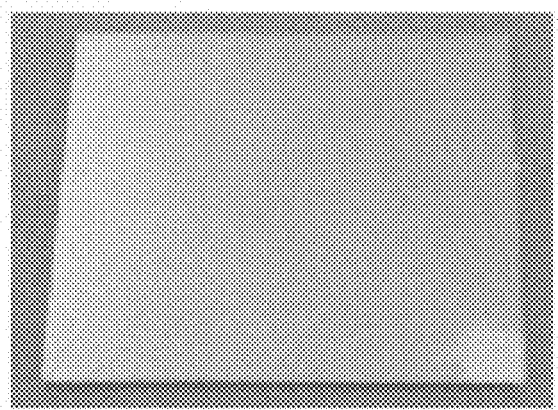
FIGS. 17A and 17B are photographs of the appearances of polyurea films produced by different methods.
Figure 17B:
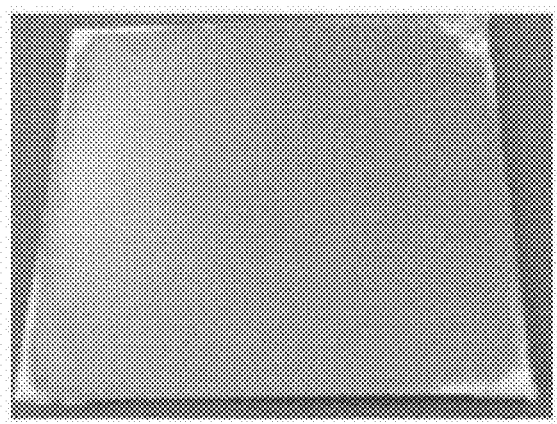

The results of Examples 3-1 to 3-5 and Comparative Examples 3-1 to 3-4 are shown in Table 2. Appearance photographs of the polyurea films 23 according to Example 3-4 and Comparative Example 3-4 are shown in FIGS. 17A and 17B, respectively.

TABLE 2

|  |  | Concentration [wt %] | Total coating amount [μml] | Adherence weight [mg] | Film thickness [μm] |
|---|---|---|---|---|---|
| Mixed coating | Example 3-1 | 1.0 | 500 | 0.3 | 0.1 |
|  | Example 3-2 | 2.0 |  | 0.8 | 0.3 |
|  | Example 3-3 | 2.5 |  | 1.1 | 0.5 |
|  | Example 3-4 | 5.0 |  | 1.7 | 0.7 |
|  | Example 3-5 | 20 |  | 7.7 | 3.6 |
| Alternate coating | Comparative Example 3-1 | 0.1 | 2,000 | 0.4 | 0.2 |
|  | Comparative Example 3-2 | 0.2 |  | 1.3 | 0.6 |
|  | Comparative Example 3-3 | 0.5 |  | 4.6 | 2.1 |
|  | Comparative Example 3-4 | 5.0 |  | 38 | 17 |

According to the results shown in Table 2, in Examples 3-1 to 3-4 in which the mixed solution was applied (mixed coating), when considering the concentrations of the isocyanate solution and the amine solution, the polyurea film 23 having a small thickness could be formed regardless of the net supply amount of the polyurea raw material being larger than that of the alternate coating according to the comparative examples. As can be noted from the appearance photograph of the polyurea film 23 according to Example 3-4 shown in FIG. 17A, in the case of the polyurea films 23 according to Examples 3-1 to 3-5, it was possible to form the polyurea films 23 having a relatively uniform film thickness in the plane of the silicon substrate.

On the other hand, in Comparative Examples 3-1 to 3-4 in which alternate coating was performed, when considering the concentrations of the isocyanate solution and the amine solution, it was difficult to form the polyurea film 23 having a small thickness regardless of the net supply amount of the polyurea raw material being smaller than that of the mixed coating. As can be noted from the appearance photograph of the polyurea film 23 according to Comparative Example 3-4 shown in FIG. 17B, in the case of the polyurea films 23 according to Comparative Examples 3-1 to 3-4, unevenness in the film thickness of the polyurea film 23 was present in the plane of the silicon substrate and it was difficult to form the polyurea film 23 having a uniform film thickness.

According to the experimental results of Examples 3-1 to 3-5 and Comparative Examples 3-1 to 3-4 confirmed above, it can be said that the mixed coating having good film thickness controllability and good in-plane film thickness uniformity is a method effective when applied to form the polyurea film 23 in a manufacturing process of a semiconductor device.

According to the present disclosure in some embodiments, first and second liquids for forming a polymer film having a urea bond on a substrate are mixed with each other inside a liquid flow path and then supplied to a substrate. Therefore, by changing a mixing ratio of these liquids, it is possible to form the polymer film on the surface of the substrate while adjusting the time until the polymer having a urea bond is formed or adjusting a film thickness of the polymer film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus for processing a substrate to manufacture a semiconductor device, comprising:
    a mounting table on which a substrate is mounted;
    a first liquid supply part configured to supply a first liquid containing an isocyanate and a first solvent to form a polymer film having a urea bond on the substrate mounted on the mounting table;
    a second liquid supply part configured to supply a second liquid that reacts with the first liquid; and
    a nozzle part provided at an end portion of a liquid flow path where the first liquid supplied from the first liquid supply part and the second liquid supplied from the second liquid supply part are joined with each other to obtain a mixed solution, and configured to supply the mixed solution to the substrate to form the polymer film on a surface of the substrate mounted on the mounting table.

2. The apparatus of claim 1, wherein the second liquid contains an amine and a second solvent, and the polymer film is formed by a copolymerization of the isocyanate and the amine contained in the mixed solution.

3. The apparatus of claim 1, wherein the second liquid contains a water, and the polymer film is formed by a self-polymerization of the isocyanate that reacted with the water contained in the mixed solution.

4. The apparatus of claim 1, further comprising:
    a solvent supply part configured to supply a diluting solvent for adjusting a concentration of the mixed solution to the liquid flow path.

5. The apparatus of claim 4, further comprising:
    a flow rate adjustment part configured to adjust a flow rate of each of the first liquid, the second liquid and the diluting solvent supplied to the liquid flow path; and
    a flow rate setting part configured to set a flow rate to be adjusted by the flow rate adjustment part based on a correspondence relationship between a film thickness of the polymer film formed on the substrate and the flow rates of the first liquid, the second liquid and the diluting solvent.

6. The apparatus of claim 1, wherein the mounting table is configured to be rotatable about a central axis while horizontally holding the substrate,
    the apparatus further comprising: a cup provided around the mounting table and configured to receive the mixed solution scattering from the substrate being rotated and to discharge the received mixed solution to the outside.

7. The apparatus of claim 6, further comprising: a cleaning solvent nozzle installed in the cup and configured to supply a cleaning solvent for cleaning the mixed solution adhering to the cup.

8. The apparatus of claim 6, further comprising:
    a cleaning solvent nozzle configured to supply a cleaning solvent for cleaning the mixed solution adhering to the cup to the surface of the substrate on which the polymer film is formed,
    wherein the cleaning solvent nozzle supplies the cleaning solvent to the surface of the substrate being rotated so as to scatter the cleaning solvent toward the cup and clean the mixed solvent adhering to the cup.

9. The apparatus of claim 8, further comprising:
    a heating part configured to heat the substrate mounted on the mounting table to promote the formation of the polymer film.

10. The apparatus of claim 3, further comprising:
    a mixed solution heating part configured to heat at least one of the liquid flow path and the nozzle part, through which the mixed solution flows, to promote the formation of the polymer film.

11. The apparatus of claim 2, wherein the first liquid and the second liquid are used to form the polymer film after a time elapse of 60 minutes or more from the mixing of the isocyanate with the first solvent or the mixing of the amine with the second solvent.

12. The apparatus of claim 11, wherein a time period from a time when the mixed solution is obtained inside the liquid flow path by mixing the first liquid and the second liquid until a time when the mixed solution supplied to the substrate mounted on the mounting table is discharged falls within a range of 10 minutes or less.

* * * * *